(12) United States Patent
Choo et al.

(10) Patent No.: US 9,313,932 B2
(45) Date of Patent: Apr. 12, 2016

(54) ELECTRONIC CONTROL APPARATUS FOR VEHICLE USING OVERMOLDING AND MANUFACTURING METHOD THEREOF

(71) Applicant: Hyundai Autron Co., Ltd., Seongnam-si (KR)

(72) Inventors: Yeon Chul Choo, Seoul (KR); Sun Jae Yang, Gunpo-si (KR); Chang Ju Kim, Uijeongbu-si (KR); Seung Mok Song, Seongnam-si (KR); Ju Hyung Lee, Suwon-si (KR)

(73) Assignee: HYUNDAI AUTRON CO., LTD., Seongnam-Si (KR)

( * ) Notice: Subject to any disclaimer, the term of this patent is extended or adjusted under 35 U.S.C. 154(b) by 168 days.

(21) Appl. No.: 14/139,842

(22) Filed: Dec. 23, 2013

(65) Prior Publication Data

US 2014/0313675 A1 Oct. 23, 2014

(30) Foreign Application Priority Data

Apr. 19, 2013 (KR) ........................ 10-2013-0043500

(51) Int. Cl.
*H05K 7/20* (2006.01)
*H05K 13/00* (2006.01)
(Continued)

(52) U.S. Cl.
CPC .............. *H05K 7/20854* (2013.01); *G06F 1/20* (2013.01); *H01L 21/44* (2013.01); *H05K 5/0034* (2013.01); *H05K 5/06* (2013.01); *H05K 5/065* (2013.01); *H05K 7/20* (2013.01); *H05K 13/0023* (2013.01); *Y10T 29/49146* (2015.01)

(58) Field of Classification Search
CPC ..... H05K 7/20; H05K 3/284; H05K 7/20854; H05K 13/0023; H05K 5/0034; H05K 5/065; H05K 5/0069; H05K 5/06; H05K 1/14; G06F 1/20; B60R 16/0239; F02D 2400/18; H01L 21/44; B29C 47/92
USPC ............ 361/679.54, 704, 705, 707, 709, 710, 361/714, 715, 719, 722, 730, 732, 736, 737, 361/752; 257/706, 707, 711–713, 722–724, 257/686, 678, 687; 29/832, 840, 841, 842, 29/846–852; 264/40.1, 40.5, 40.6; 438/106–124; 174/520, 521, 50.5, 174/50.51, 50.52
See application file for complete search history.

(56) References Cited

U.S. PATENT DOCUMENTS 3,904,078 A * 9/1975 Neff et al. ........................ 222/1
5,645,775 A * 7/1997 Spahr et al. ................. 264/40.5
(Continued)

FOREIGN PATENT DOCUMENTS

JP 2004-111435 A 4/2004

*Primary Examiner* — Michail V Datskovskiy
(74) *Attorney, Agent, or Firm* — Mayer Brown LLP; Hyunho Park

(57) ABSTRACT

The present disclosures provides an electronic control apparatus for a vehicle using overmolding in which a heat radiating plate is attached to an opposite side of a part requiring heat radiation in a printed circuit board (PCB) and a part other than the part, to which the heat radiating plate is attached, is overmolded so as to directly discharge heat to the air through the heat radiating plate such that a heat radiation effect is excellent, the heat radiating plate is attached in advance and then a housing is formed of mold resin such that a manufacturing process is simplified, and a printed circuit board (PCB) is surrounded by mold resin such that a waterproof function is excellent, and a manufacturing method thereof.

5 Claims, 6 Drawing Sheets

(51) Int. Cl.
*G06F 1/20* (2006.01)
*H01L 21/44* (2006.01)
*H05K 5/06* (2006.01)
*H05K 5/00* (2006.01)

(56) References Cited

U.S. PATENT DOCUMENTS

| | | | |
|---|---|---|---|
| 5,774,342 A * | 6/1998 | Brandenburg et al. | 361/774 |
| 5,957,547 A * | 9/1999 | Schliebe et al. | B60T 8/368 303/119.3 |
| 6,282,092 B1 * | 8/2001 | Okamoto et al. | H01L 23/142 165/80.3 |
| 6,285,551 B1 * | 9/2001 | Brandenburg et al. | 361/704 |
| 6,291,880 B1 * | 9/2001 | Ogawa et al. | 257/723 |
| 6,350,631 B1 * | 2/2002 | Kobayashi et al. | 438/107 |
| 6,779,260 B1 * | 8/2004 | Brandenburg et al. | 29/841 |
| 7,134,194 B2 * | 11/2006 | Brandenburg et al. | 29/832 |
| 7,151,674 B2 * | 12/2006 | Sasaki et al. | 361/752 |
| 7,359,212 B2 * | 4/2008 | Mayuzumi et al. | 361/760 |
| 7,458,823 B2 * | 12/2008 | Sugimoto et al. | B29C 45/14065 439/736 |
| 7,473,585 B2 * | 1/2009 | Brandenburg et al. | 438/124 |
| 7,576,991 B2 * | 8/2009 | Naritomi | 361/748 |
| 7,616,448 B2 * | 11/2009 | Degenkolb et al. | 361/752 |
| 7,924,572 B2 * | 4/2011 | Mayuzumi et al. | 361/753 |
| 8,093,692 B2 * | 1/2012 | Obara | 257/668 |
| 2002/0019072 A1 * | 2/2002 | Kobayashi et al. | 438/107 |
| 2006/0131771 A1 * | 6/2006 | McBain et al. | 264/40.1 |
| 2006/0272150 A1 * | 12/2006 | Eguchi et al. | 29/841 |
| 2010/0201028 A1 * | 8/2010 | Yoo et al. | 264/259 |
| 2011/0210461 A1 * | 9/2011 | Kariya et al. | 264/40.6 |

* cited by examiner

ELECTRONIC CONTROL APPARATUS FOR VEHICLE USING OVERMOLDING AND MANUFACTURING METHOD THEREOF

CROSS-REFERENCE TO RELATED APPLICATIONS

This application is based on and claims priority from Korean Patent Application No. 10-2013-0043500, filed on Apr. 19, 2013, with the Korean Intellectual Property Office, the disclosure of which is incorporated herein in its entirety by reference.

TECHNICAL FIELD

The present disclosure relates to an electronic control apparatus for a vehicle, and more particularly, to an electronic control apparatus having a heat radiation and waterproof structure using overmolding in an electronic control apparatus, such as an engine electronic control unit (ECU) of a vehicle.

BACKGROUND

In general, an electronic control apparatus such as an ECU, which electronically controls various types of devices, is equipped in a vehicle. The electronic control apparatus receives information from sensors or switches installed at each part of the vehicle. The electronic control apparatus serves to perform various electronic controls for promoting improvement of a riding quality and safety of the vehicle or providing various items of convenience to a driver and a passenger by processing the received information.

For example, the electronic control apparatus such as the ECU, which controls states of an engine, an automatic transmission, an anti-lock brake system (ABS), and the like in the vehicle using a computer, also serves to control all parts in the vehicle, such as a driving system, a braking system, and a steering system as well as the automatic transmission as the vehicle and the computer have been developed in terms of performance.

The electronic control apparatus such as the ECU has a structure that includes a case which includes an upper cover and a lower base, a printed circuit board (PCB) which is accommodated in the case, a connector which is coupled to a front end of the PCB so as to be connected to an external socket, and the like.

The cover and the base are assembled together with the PCB while covering the PCB, and particularly, the connector, which is interposed between the cover and the base when the cover and the base are assembled, forms a sealing structure with the cover side and the base side.

The electronic control apparatus includes a high integrated control circuit means and thus requires a predetermined sealing structure that may prevent external moisture or foreign substances from flowing into the electronic control apparatus, and the electronic control apparatus mainly adopts a sealing structure in which the cover and the base are typically assembled together with the connector in a state in which sealing materials are inserted on binding parts between the cover and the base and the connector so as to protect the PCB and the like in the electronic control apparatus.

In the meantime, in the electronic control apparatus, heating elements are provided on a top side of the PCB, and a heat radiation paste is attached onto a bottom side of the PCB. The cover and the base are fastened by a screw. Here, the structure coupled by the screw method may become loose, and external contaminants or moisture may flow into the structure. In the electronic control apparatus in the related art, heat generated from the heating element is discharged to the cover surrounding the PCB. To this end, the cover may include a part which may discharge heat. However, heat generated from the heating element of the PCB is not directly discharged to the outside through the base made of a metal material, so that heat radiation performance may deteriorate.

SUMMARY

The present disclosure has been made in an effort to provide an electronic control apparatus for a vehicle using overmolding in which a heat radiating plate is attached to an opposite side of a part requiring heat radiation in a printed circuit board (PCB) and a part other than the part, to which the heat radiating plate is attached, is overmolded so as to directly discharge heat to the air through the heat radiating plate such that a heat radiation effect is excellent, the heat radiating plate is attached in advance and then a housing is formed of mold resin such that a manufacturing process is simplified, and a printed circuit board (PCB) is surrounded by mold resin such that a waterproof function is excellent, and a manufacturing method thereof.

An exemplary embodiment of the present disclosure provides an electronic control apparatus for a vehicle, including: a printed circuit board (PCB) including an electronic control substrate configured to electrically control each part of the vehicle, and electronic components positioned on one surface of the electronic control substrate; a heat radiating plate attached to the other surface part of the electronic control substrate, which is opposite to the one surface part on which the electronic components are positioned, for heat radiation of the electronic components; a connector including a connector pin, and coupled to the PCB; and an overmold housing configured to overmold the PCB, to which the heat radiating plate is attached, with mold resin, in such a manner that the remaining parts of the other surface of the electronic control substrate other than the other surface part, to which the heat radiating plate is attached, are overmolded.

The overmold housing may overmold the other surface part of the PCB other than the heat radiating plate, in such a manner that the overmold housing surrounds an outer portion of the heat radiating plate.

The heat radiating plate may be formed of a metal material or may be a pad type plate.

The overmold housing may be injection-molded in a state of being maintained at a temperature and pressure equal to or lower than a predetermined failure threshold temperature and pressure of the electronic control substrate or the heating element.

Another exemplary embodiment of the present disclosure provides method of manufacturing an electronic control apparatus for a vehicle, including: coupling a printed circuit board (PCB), which includes an electronic control substrate configured to electrically controlling each part of the vehicle and electronic components positioned on one surface of the electronic control substrate, to a connector including a connector pin; attaching a heat radiating plate onto the other surface part of the electronic control substrate opposite to the one surface part on which the electronic components are positioned; and inserting the PCB, to which the heat radiating plate is attached, into upper and lower molds, in which the remaining parts of the other surface of the electronic control substrate other than the other surface part, to which the heat radiating plate is attached, are overmolded, injecting mold resin, and overmolding the PCB.

The overmolding may include overmolding the other surface part of the PCB other than the heat radiating plate, in such a manner that the mold resin is injected so as to surround an outer portion of the heat radiating plate.

The molding may include injection-molding the PCB, to which the heat radiating plate is attached, in a state where inner sides of the molds are maintained at a temperature and pressure equal to or lower than a predetermined failure threshold temperature and pressure of the electronic control substrate or the heating element.

According to the exemplary embodiments of the present disclosure, it is possible to obtain an excellent radiating effect by directly discharging heat generated from the electronic components to the air through the heat radiating plate attached to the PCB. Particularly, in the exemplary embodiments of the present disclosure, the heat radiating plate is overmolded so as to surround only the outer portion of the heat radiating plate with mold resin, so that heat generated from the electronic components may be directly discharged to the air through the heat radiating plate part which is not surrounded by the mold resin.

According to the exemplary embodiment of the present disclosure, the heat radiating plate is attached in advance, and then the PCB to which the heat radiating plate is attached is inserted into the molds and the housing is formed by the mold resin, so that it is possible to simplify a manufacturing process of the electronic control apparatus.

According to the exemplary embodiments of the present disclosure, the PCB including the electronic components and the PCB and the connector are surrounded by the mold resin, so that a waterproof function may be excellent.

According to the exemplary embodiments of the present disclosure, the housing is formed by the overmold housing, thereby allowing the electronic control apparatus to become lighter compared to other housings.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
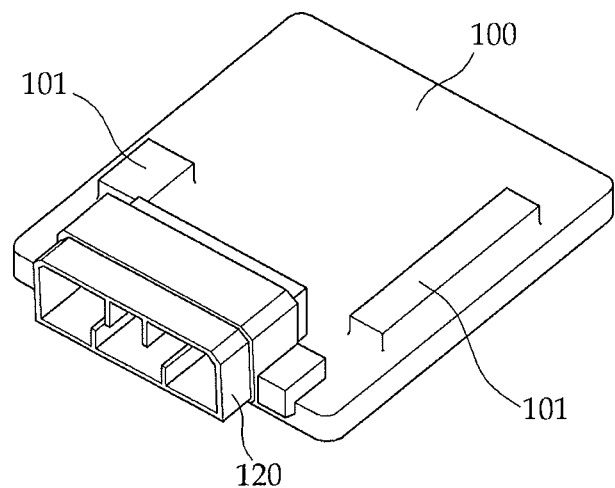
FIGS. 1A and 1B show coupling perspective views illustrating an electronic control apparatus for a vehicle according to an exemplary embodiment of the present disclosure.

Hereinafter, an exemplary embodiment of the present disclosure will be described in detail with reference the accompanying drawing. A configuration and an operational effect according to the configuration of the present disclosure will be clearly understood through the detailed description below. In the following description, the same elements will be designated by the same reference numerals although they are shown in different drawings, and a detailed explanation of known related functions and constitutions may be omitted when it is determined that the detailed explanation obscures the subject matter of the present disclosure.

Figure 1B:
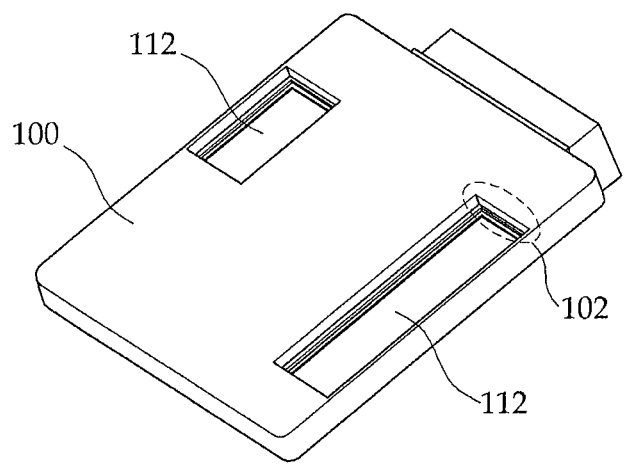
Figure 2:
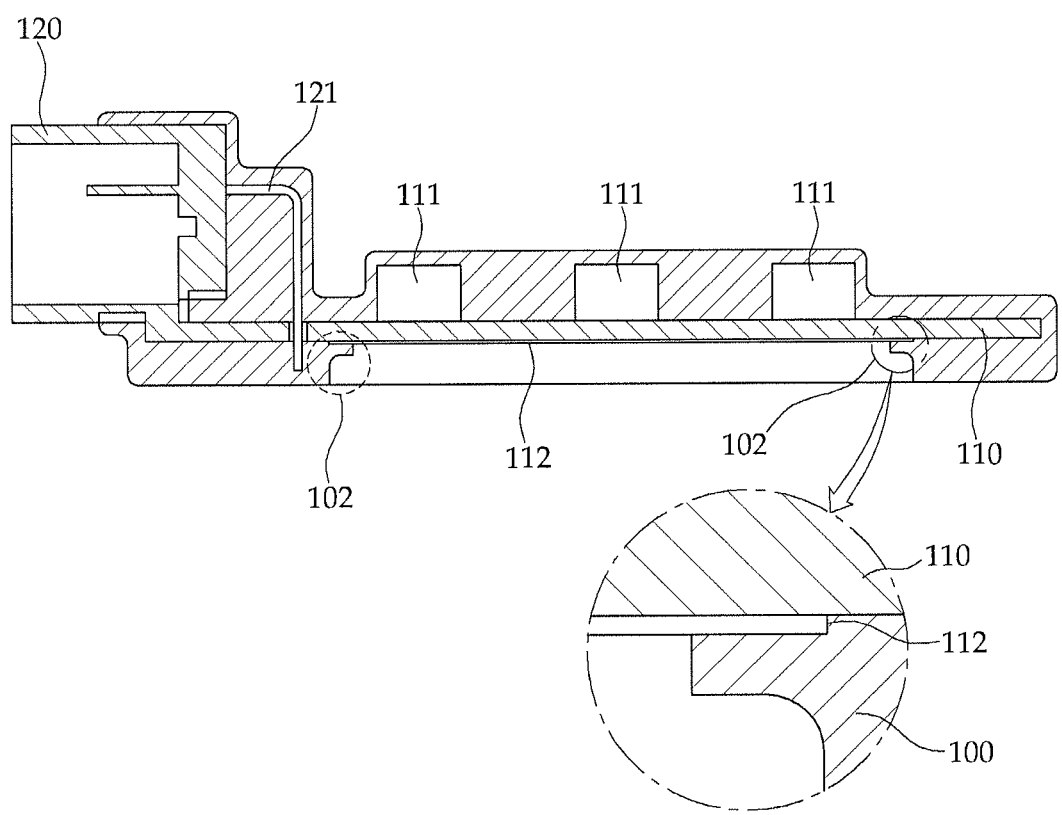
FIG. 2 shows a cross-sectional perspective view illustrating the electronic control apparatus for the vehicle according to the exemplary embodiment of the present disclosure.

FIGS. 1A and 1B show coupling perspective views illustrating an electronic control apparatus for a vehicle according to an exemplary embodiment of the present disclosure, and FIG. 2 shows a cross-sectional perspective view illustrating the electronic control apparatus for the vehicle according to the exemplary embodiment of the present disclosure.

As illustrated in FIGS. 1A and 1B, the electronic control apparatus is a component including a printed circuit board (PCB), for example, an integrated control circuit means, such as a PCB 110, which electrically controls each part of the vehicle, and needs a heat radiation structure of discharging heat generated from electronic components namely, heating elements 111 positioned on the PCB 110 to the air, and a housing structure for preventing external moisture or foreign substances from flowing in. The electronic control apparatus has an overmold housing 100 accommodating the PCB 110 and the like inside and having an overmolding structure. A connector 120 is coupled to a front portion of the overmold housing 100.

In order to prevent external moisture or foreign substances from flowing in, the overmold housing 100 is overmolded in a form surrounding the electronic control element. The overmold housing 100 includes a heating element part 101 overmolded so as to surround the heating elements 111. In order to discharge heat generated from the heating elements 111, the overmold housing 100 does not surround a heat radiating plate 112. The overmold housing 100 may be implemented by molding only an outer portion 102 of the heat radiating plate 112.

As illustrated in FIG. 2, the electronic control apparatus for the vehicle according to the exemplary embodiment of the present disclosure includes the electronic control element including the PCB 110 and the heating elements 111 of the PCB 110, the heat radiating plate 112, the connector 120, and the overmold housing 100.

The electronic control element includes the PCB 110 electrically controlling each part of the vehicle, and the heating elements 111 positioned on one surface of the PCB 110.

The heat radiating plate 112 is attached to the other surface part opposite to one surface part, on which the heating elements 111 are positioned, among the other surfaces of the PCB 110 for the heat radiation of the heating elements 111. For example, the heat radiating plate 112 may be formed of a metal or may be a pad type plate.

Here, the heating element 111 may be positioned on a top side or a bottom side of the PCB 110. When the heating elements 111 are positioned on the top side of the PCB 110, the heat radiating plate 112 is attached onto the bottom side of the PCB 110. On the contrary to this, when the heating elements 111 are positioned on the bottom side of the PCB 110, the heat radiating plate 112 is attached onto the top side of the PCB 110.

The connector 120 includes a connector pin 121, and is coupled to the electronic control element. The connector 120 is connected with the electronic control element through the connector pin 121. The connector pin 121 may have a plurality of pins for a connection with the internal PCB 110 and a plurality of pins for a connection with an external device. The connector 120 may be coupled in a form fitted to the electronic control element. The connector 120 may be formed in an integrated form of a front end portion exposed to the outside and a rear end portion.

The overmolding housing 100 is formed to overmold the electronic control element to which the heat radiating plate 112 is attached with mold resin. In this case, the overmold housing 100 is formed to overmold the remaining parts of the other surface of the PCB 110 other than the other surface part to which the heat radiating plate 112 is attached.

The outer portion 102 of the heat radiating plate 112 will be described with reference to a detailed portion of FIG. 2. The overmold housing 100 overmolds the other surface part of the PCB 110 other than the heat radiating plate 112, in such a manner that the other surface part of the PCB 110 may be molded so as to surround the outer portion 102 of the heat radiating plate 112. When the outer portion 102 of the heat radiating plate 112 is surrounded with the mold resin, the electronic control element including the PCB 110 and the heating elements 111 may be protected from inflow of moisture.

In the meantime, the overmold housing 100 may be overmolded with a resin material injection-molded at a temperature and pressure equal to or lower than a predetermined temperature and pressure. This is for the purpose of preventing failure from being generated from the heating element 111 and the like due to high-temperature or high pressure injection-molding. The overmolding housing 100 may be formed of hardened plastic, such as a thermosetting material. The overmolding housing 100 may be formed of a plastic material having elasticity, such as a thermoplastic elastomeric material.

Figure 3:
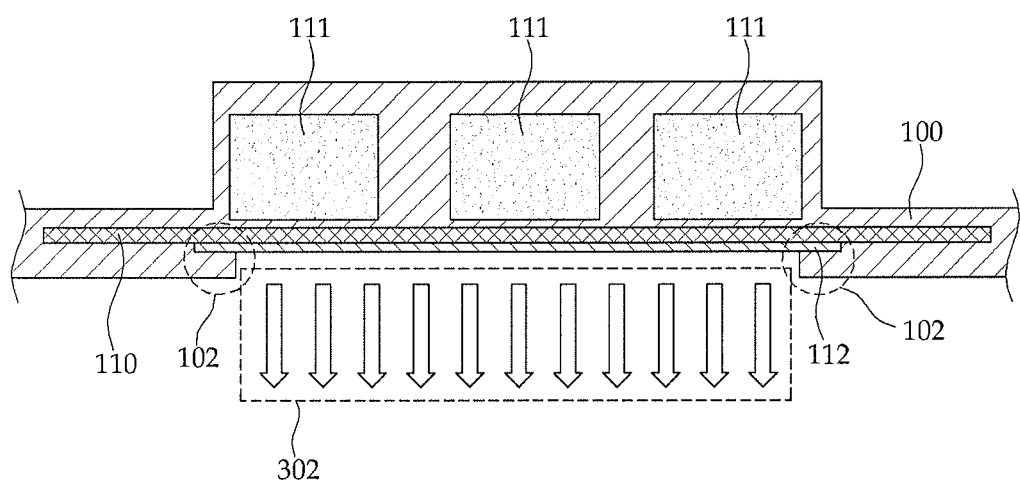
FIG. 3 shows diagrams describing a structure of radiating heat generated from heating elements in the electronic control apparatus for the vehicle according to the exemplary embodiment of the present disclosure.

FIG. 3 shows diagrams describing a structure of radiating heat generated from the heating elements in the electronic control apparatus for the vehicle according to the exemplary embodiment of the present disclosure.

As illustrated in FIG. 3, the heating elements 111 are positioned on the top side of the PCB 110. The heat radiating plate 112 is attached onto the bottom side which is the opposite side of the portion in which the heating elements 111 are positioned. The overmolding housing 100 molds and surrounds the heating elements 111 and the PCB 110. Accordingly, heat generated from the heating elements 111 is directly discharged to the air 302 through the heat radiating plate 112 via the PCB 110. As described above, the electronic control apparatus directly discharges heat to the air 302 through the heat radiating plate 112, thereby achieving an excellent heat radiating effect.

The overmold housing 100 illustrated in FIG. 3 molds from both ends of the bottom side of the PCB 110 to the outer portion 102 of the heat radiating plate 112. Here, the overmold housing 100 may mold from both ends of the bottom side of the PCB 110 to the outer portion 102 of the heat radiating plate 112 with the same thickness.

In the meantime, in the overmold housing 100, a part of the outer portion 102 illustrated in FIG. 3 may be molded to have a different thickness from that of the outer portion 102 illustrated in FIG. 3. Investigating the outer portion 201 illustrated in FIG. 3, the outer portion 102 of the heat radiating plate 112 attached with the PCB 110 may be molded in a smaller thickness than that of the portion to which the heat radiating plate 112 is not attached. That is, the overmold housing 100 may be molded in a stepped form at the outer portion 102 of the heat radiating plate 112.

Figure 4A:
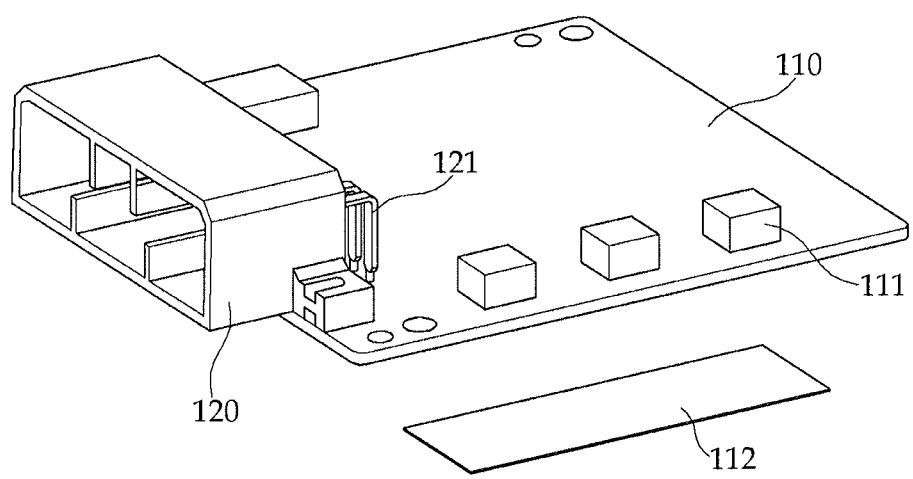
FIGS. 4A to 4C show process diagrams illustrating a manufacturing method of the electronic control apparatus for the vehicle using overmolding according to the exemplary embodiment of the present disclosure.
Figure 4B:
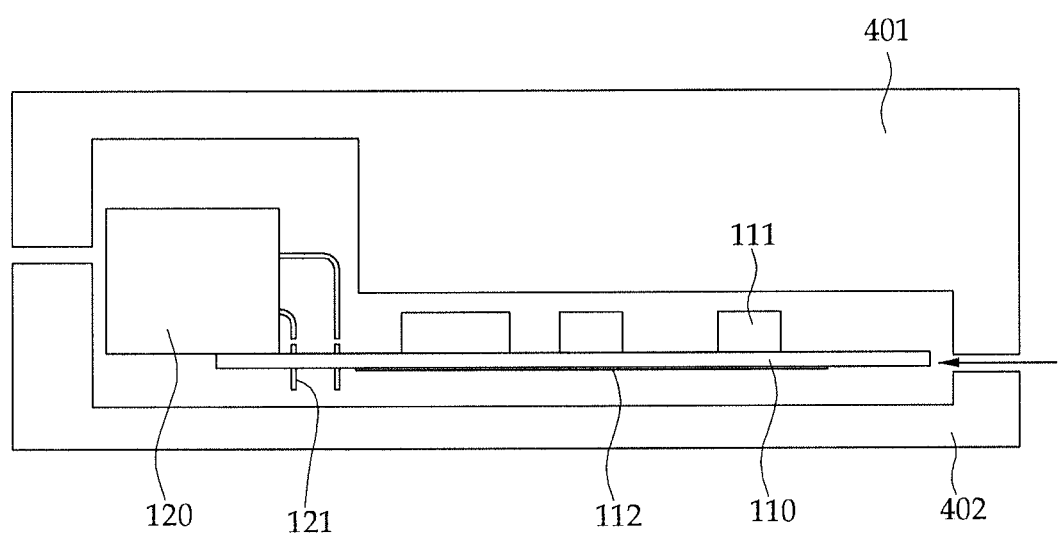
Figure 4C:
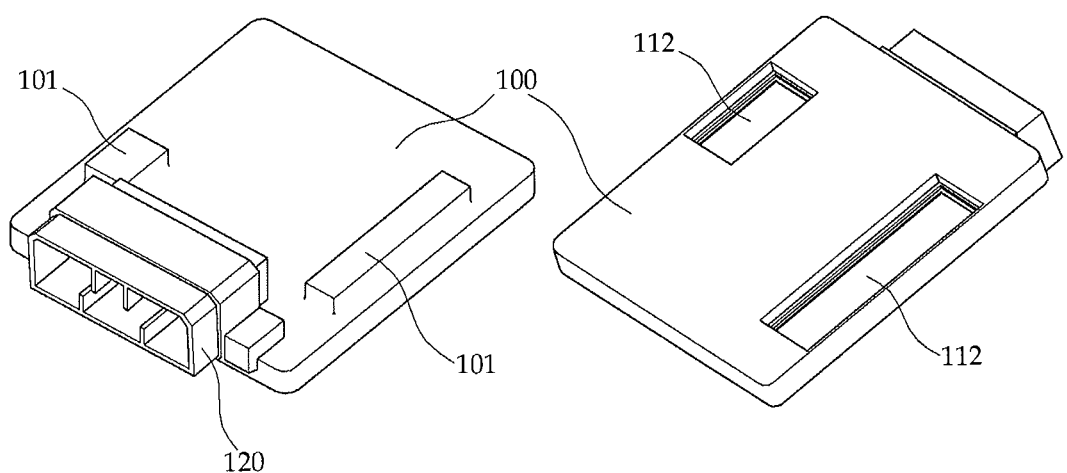

FIGS. 4A to 4C show process diagrams illustrating a manufacturing method of the electronic control apparatus for the vehicle according to the exemplary embodiment of the present disclosure.

The electronic control apparatus of the vehicle is manufactured in an order from FIGS. 4A to 4C.

As illustrated in FIG. 4A, in the manufacturing process of the electronic control apparatus, the electronic control element, which includes the PCB 110 electrically controlling each part of the vehicle and the heating elements positioned on one surface of the PCB 110 is coupled to the connector 120 including the connector pin 121.

In the manufacturing process of the electronic control apparatus, the heat radiating plate 112 (for example, a metal material or a heat radiating pad) is attached to a part of the bottom side part of the PCB 110 opposite to a part of the top side part on which the heating elements 111 are positioned. Here, in a case where a plurality of heating elements 111 is positioned on the PCB 110, the heat radiating plate 112 may be formed of a plate having one heat radiating area and capable of covering the plurality of heating elements 111. In this case, when the plurality of heating elements 111 maintains a minimal interval, the heat radiating plate 112 may be formed of a plate having one heat radiating area. In a case where the plurality of heating elements 111 is positioned on the PCB 110, the heat radiating plate 112 may be formed of a plurality of plates corresponding to the plurality of heating elements 111, respectively.

Then, as illustrated in FIG. 4B, in the manufacturing process of the electronic control apparatus, the electronic control element, to which the heat radiating plate 112 is attached, is inserted into upper and lower molds 401 and 402. Here, the upper mold 401 may have a concave portion corresponding to the portion in which the heating element 111 is positioned. The lower mold 402 has a structure in which the remaining parts of the bottom side of the PCB 110 other than a part of the bottom side part, to which the heat radiating plate 112 is attached, is overmolded. That is, the lower mold 402 has a structure in which the mold resin is overmolded to the outer portion other than a center portion of the heat radiating plate 112. The upper and lower molds 401 and 402 have a form in which a part of the connector 120 is positioned outside the upper and lower molds 401 and 402.

Next, in the manufacturing process of the electronic control apparatus, the electronic control element is overmolded by injecting the mold resin through an injection opening between the upper and lower molds 401 and 402 for injection. In this case, in the manufacturing process of the electronic control apparatus, the inner sides of the upper and lower molds 401 and 402 are maintained at a predetermined failure threshold temperature and pressure of the PCB 110 or the heating element 111, and the electronic control element to which the heat radiating plate 112 is attached is injection-molded.

As illustrated in FIG. 4C, in the manufacturing process of the electronic control apparatus, after the electronic control element is overmolded, the upper and lower molds 401 and 402 are removed. Then, the electronic control apparatus has the convex heating element part 101 in which the heating element 111 is positioned, and the part of the bottom side part, to which the heat radiating plate 112 is attached, is exposed to the outside. A molding operation of the overmold housing 100 having a structure in which the remaining parts other than the plate surface of the heat radiating plate 112 are overmolded is completed.

According to the present disclosure, a heat radiating plate is attached to an opposite side of a part requiring heat radiation in a printed circuit board (PCB) and a part other than the part, to which the heat radiating plate is attached, is overmolded so as to directly discharge heat to the air through the heat radiating plate such that a heat radiation effect is excellent, the heat radiating plate is attached in advance and then a housing is formed of mold resin such that a manufacturing process is simplified, and a printed circuit board (PCB) is surrounded by mold resin such that a waterproof function is excellent. In this respect, since the present disclosure that is beyond the limit of the known art does not just utilize the related art but commercial or business possibility of equipment, to which the present disclosure is applied, is sufficient and can be clearly carried out in practice, the present disclosure has industrial applicability.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An electronic control apparatus for a vehicle, comprising:
    a printed circuit board (PCB) including an electronic control substrate configured to electrically control the electronic control apparatus of the vehicle;
    at least one heating element positioned on a surface of the electronic control substrate;
    at least one heat radiating plate having a size corresponding to a size of the at least one heating element positioned on an opposite side of the surface of the electronic control substrate where the at least one heating element is positioned;
    a connector including a connector pin, and coupled to the PCB; and
    an overmold housing configured to overmold the at least one heating element, the PCB, and an outer portion of the at least one heat radiating plate with mold resin such that heat generated from the at least one heating element is directly discharged to air through the at least one heat radiating plate positioned on the opposite side of the surface of the electronic control substrate where the at least one heating element is positioned.

2. The electronic control apparatus of claim 1, wherein the at least one heat radiating plate is formed of a metal material or is a pad type plate.

3. The electronic control apparatus of claim 1, wherein the overmold housing is injection-molded in a state of being maintained at a temperature and pressure equal to or lower than a predetermined failure threshold temperature and pressure of the electronic control substrate or the at least one heating element.

4. A method of manufacturing an electronic control apparatus for a vehicle, comprising:
    coupling a printed circuit board (PCB) including an electronic control substrate configured to electrically controlling the electronic control apparatus of the vehicle and at least one heating element positioned on a surface of the electronic control substrate to a connector including a connector pin;
    attaching at least one heat radiating plate onto an opposite side of the surface of the electronic control substrate where the at least one heating element is positioned;
    inserting the PCB, to which the at least one heat radiating plate is attached, into upper and lower molds;
    injecting mold resin; and
    overmolding the at least one heating element, the PCB, and an outer portion of the at least one heating radiating plate such that heat generated from the at least one heating element is directly discharged to air through the at least one heat radiating plate positioned on the opposite side of the surface of the electronic control substrate where the at least one heating element is positioned,
    wherein the at least one heat radiating plate has a size corresponding to a size of the at least one heating element.

5. The method of claim 4, wherein the overmolding includes injection-molding the PCB, to which the at least one heat radiating plate is attached, in a state where inner sides of the molds are maintained at a temperature and pressure equal to or lower than a predetermined failure threshold temperature and pressure of the electronic control substrate or the at least one heating element.

* * * * *